(12) United States Patent
Davidovici et al.

(10) Patent No.: US 6,212,244 B1
(45) Date of Patent: Apr. 3, 2001

(54) FAST RESPONSE AUTOMATIC GAIN CONTROL

(75) Inventors: Sorin Davidovici, Jackson Heights, NY (US); Emmanuel Kanterakis, North Brunswick, NJ (US); Izumi Iida, Shiojiri (JP); Norio Hama, Okaya (JP); Nobuhiko Kenmochi, Shiojiri (JP)

(73) Assignees: Golden Bridge Technology, Inc., West Long Branch, NJ (US); Seiko Epson Corp., Suwa (JP)

( * ) Notice: Subject to any disclaimer, the term of this patent is extended or adjusted under 35 U.S.C. 154(b) by 0 days.

(21) Appl. No.: 09/005,071

(22) Filed: Jan. 9, 1998

(51) Int. Cl.[7] .................................................. H04L 27/08
(52) U.S. Cl. ........................................ 375/345; 455/239.1
(58) Field of Search ............................ 455/239.1, 246.1; 375/345

(56) References Cited

U.S. PATENT DOCUMENTS

| | | | |
|---|---|---|---|
| 3,931,584 | * | 1/1976 | Motley et al. ....................... 330/129 |
| 4,455,681 | * | 6/1984 | Wile ................................... 455/243.1 |
| 4,459,698 | * | 7/1984 | Yumoto et al. ...................... 375/236 |
| 4,546,322 | * | 10/1985 | Crutcher .............................. 329/308 |
| 4,599,732 | * | 7/1986 | LeFever .............................. 375/346 |
| 5,321,851 | * | 6/1994 | Sugayama et al. ............... 455/161.3 |
| 5,369,792 | * | 11/1994 | Matsumoto ........................ 455/245.1 |
| 5,465,408 | * | 11/1995 | Sugayama et al. ............... 455/249.1 |
| 5,563,916 | * | 10/1996 | Scarpa ................................. 375/345 |
| 5,758,274 | * | 5/1998 | Vu et al. ............................ 455/246.1 |
| 5,764,689 | * | 6/1998 | Walley ................................. 375/147 |
| 5,917,865 | * | 6/1999 | Kopmeiner ........................... 375/345 |
| 6,002,925 | * | 12/1999 | Vu et al. .............................. 455/313 |

* cited by examiner

*Primary Examiner*—Stephen Chin
*Assistant Examiner*—Paul N Rupert
(74) *Attorney, Agent, or Firm*—McDermott, Will & Emery

(57) ABSTRACT

A two-step automatic-gain-control (AGC) loop for use with a receiver. An AGC amplifier amplifies a received signal. From an output signal from the AGC amplifier, a received-signal-strength-indicator (RSSI) circuit generates an RSSI signal proportional to a received-signal-power level of the received signal. An RSSI-mapping circuit has an RSSI-mapping table. From the RSSI signal, the RSSI-mapping circuit, using the RSSI-mapping table, generates an AGC signal. An AGC-storing circuit stores the AGC signal. The AGC amplifier uses the stored-AGC signal to adjust the AGC gain. A converter circuit converts the output signal from the AGC amplifier to an in-phase component and a quadrature-phase component at a processing frequency. The error circuit determines an error signal from the in-phase component and the quadrature-phase component. When the error signal indicates the in-phase component and the quadrature-phase component are high, the integrate-and-dump circuit increments a counter of the integrate-and-dump circuit. When the error signal indicates the in-phase component and the quadrature-phase component are low, the integrate-and-dump circuit decrements the counter of the integrate-and-dump circuit. An AGC-convergence-rate multiplier normalizes an output of the integrate-and-dump circuit, thereby generating a normalized signal. The AGC-storing circuit updates the AGC signal from the normalized signal. From the updated AGC signal, the AGC circuit adjusts the AGC gain.

13 Claims, 4 Drawing Sheets

A TWO STEP FAST AGC CONTROL LOOP

FAST RESPONSE AUTOMATIC GAIN CONTROL

BACKGROUND OF THE INVENTION

This invention relates to spread-spectrum communications, and more particularly to a two-step fast automatic-gain-control (AGC) loop capable of adjusting the gain of an AGC amplifier to compensate for large variations in received signal power.

DESCRIPTION OF THE RELEVANT ART

The evolution of telecommunications to very high data rates with packet transmissions over the air has imposed great constraints on the receiving system radio frequency (RF) stages as well as on the operation of the analog-to-digital converters in the case of digital communications. Due to large variations in received signal power caused by propagation attenuation, a control mechanism is required, by which the gain of a receiving amplifier is altered so that subsequent RF sections and/or digital sections of the receiving system operate close to an optimum operating point. These sections include amplifiers, mixers, analog-to-digital converters and baseband analog or digital processing devices. The control mechanism for adjusting the amplification of the received signal level is referred to as the automatic-gain-control (AGC) circuit.

The requirement of the AGC circuit is to keep the amplified received signal at a constant level over a large dynamic range of received signal power levels. The three main parameters when designing an AGC circuit are its operational range, its response time and its steady-state error. The operational range of an AGC circuit can easily exceed 70 dB or 80 dB in signal power.

Normally, in dynamic systems, the response time of the system is inversely proportional to its steady state error. In high data rate digital communications, and especially in packet switched systems, the conflict between these last two parameters becomes increasingly important. In these types of systems, the data transmission interval could be as small as a few hundred microseconds, if not a few tens of microseconds. In these cases, the system should adjust the gain of the received signal during only a small portion at the onset of signal reception, and operate with the smallest possible error during the remainder of the data reception.

SUMMARY OF THE INVENTION

A general object of the invention is to receive spread-spectrum signals having large variations in received signal power, caused by propagation, multipath, and other effects on a signal propagating over a communications channel.

Another object of the invention is to keep the amplified received signal at a constant level over a large range of received signal power levels.

According to the present invention, as embodied and broadly described herein, a two-step fast automatic-gain-control (AGC) loop, for use with a receiver, is provided. The first step is a coarse adjustment and the second step is a fine adjustment.

The AGC loop broadly includes an AGC amplifier, a received-signal-strength-indicator (RSSI) circuit, an RSSI-mapping circuit, an AGC-storing circuit, a converter circuit, an error circuit, an integrate-and-dump circuit and a normalizing circuit. The AGC amplifier has an AGC gain, and amplifies a received signal. The received signal, in a preferred embodiment, is a packet-spread-spectrum signal. A packet-spread-spectrum signal, as used herein, is a spread-spectrum signal transmitted by one or more transmitters, and arriving at the input of one or more receivers.

The packet-spread-spectrum signal includes a header concatenated with at least one channel of a spread-spectrum signal. For one channel, the header is concatenated with a single channel, spread-spectrum signal. The header, alternatively, may be concatenated with a multichannel, spread-spectrum signal. Timing may be triggered from the header part of the packet-spread-spectrum signal. For the case of the packet-spread-spectrum signal, each packet has the header followed in time by the channel of the spread-spectrum signal. The header and the channel of the spread-spectrum signal are sent as the packet-spread-spectrum signal, and the timing for the channel of the spread-spectrum signal, and thus the data, in the packet-spread-spectrum signal is keyed from the header. The data in the channel of the spread-spectrum signal may contain information such as digitized voice, signaling, adaptive power control (APC), cyclic-redundancy-check (CRC) code, etc.

The header, or preamble, is generated from spread-spectrum processing a header-symbol-sequence signal with a chip-sequence signal. The channel part of the packet-spread-spectrum signal is generated from spread-spectrum processing a data-sequence signal with a chip-sequence signal, or a plurality of data-sequence signals with a plurality of chip-sequence signals, respectively.

At each of the receivers, the translating device, e.g., down converter, translates the received packet-spread-spectrum signal from the carrier frequency to a processing frequency. The processing frequency may be at a radio frequency (RF), intermediate frequency (IF) or at baseband frequency. The processing frequency is a design choice, and any of the frequency ranges may be used by the invention.

For coarse adjustment using the AGC loop, the RSSI circuit generates, from an output signal from the AGC amplifier, an RSSI signal proportional to a received-signal-power level of the received signal. The RSSI-mapping circuit has an RSSI-mapping table. From the RSSI signal, the RSSI-mapping circuit, using the RSSI-mapping table, generates an AGC signal.

The AGC-storing circuit stores the AGC signal. Using the value of the stored-AGC signal, the AGC amplifier adjusts the AGC gain.

For many systems, the coarse adjustment requires finer adjustment. For fine adjustment using the AGC loop, the converter circuit converts the output signal from the AGC amplifier to an in-phase component and a quadrature-phase component at a processing frequency. The error circuit determines an error signal from the in-phase component and the quadrature-phase component. In response to the error signal indicating that both the in-phase component and the quadrature-phase component are high, the integrate-and-dump circuit increments a counter of the integrate-and-dump circuit. In response to the error signal indicating that both the in-phase component and the quadrature-phase component are low, the integrate-and-dump circuit decrements the counter of the integrate-and-dump circuit. In response to the error signal indicating the in-phase component and the quadrature-phase component are different, the integrate-and-dump circuit does not change the counter of the integrate-and-dump circuit. An output signal from the integrate-and-dump circuit is denoted an I&D signal.

The normalizing circuit, which may be embodied as an AGC-convergence-rate multiplier, normalizes the I&D signal. The output of the normalizing circuit is called a normalized signal.

The AGC-storing circuit updates the stored-AGC signal from the normalized signal. Using the updated AGC signal, the AGC circuit adjusts the AGC gain.

The present invention also includes a two-step fast automatic-gain-control (AGC) method, for use with a receiver. The method uses an AGC amplifier with an AGC gain. The method comprises the steps of amplifying, with the AGC amplifier, a received signal and generating a received-signal-strength-indicator (RSSI) signal proportional to a received-signal-power level of the received signal. The method includes the steps of mapping, using an RSSI mapping table, an AGC signal; storing the AGC signal; and adjusting, in response to the stored-AGC signal, the AGC gain of the AGC amplifier.

When finer adjustment is necessary, the method further includes the steps of converting an output signal from the AGC amplifier to an in-phase component and a quadrature-phase component at a processing frequency; determining an error signal from the in-phase component and the quadrature-phase component; incrementing, in response to the error signal indicating both the in-phase component and the quadrature-phase component are high, a counter of the integrate-and-dump circuit; decrementing, in response to the error signal indicating both the in-phase component and the quadrature-phase component are low, the counter of the integrate-and-dump circuit; and not changing, in response to the error signal indicating the in-phase component and the quadrature-phase component are different, the counter of the integrate-and-dump circuit. An output signal from the integrate-and-dump circuit is denoted an I&D signal.

The method further includes the steps of normalizing the I&D signal, thereby generating a normalized signal; updating, in response to the normalized signal, the stored-AGC signal; and adjusting, in response to the updated AGC signal, the AGC gain of the AGC amplifier.

Additional objects and advantages of the invention are set forth in part in the description which follows, and in part are obvious from the description, or may be learned by practice of the invention. The objects and advantages of the invention also may be realized and attained by means of the instrumentalities and combinations particularly pointed out in the appended claims.

BRIEF DESCRIPTION OF THE DRAWINGS

The accompanying drawings, which are incorporated in and constitute a part of the specification, illustrate preferred embodiments of the invention, and together with the description serve to explain the principles of the invention.

DETAILED DESCRIPTION OF THE PREFERRED EMBODIMENTS

Figure 1:
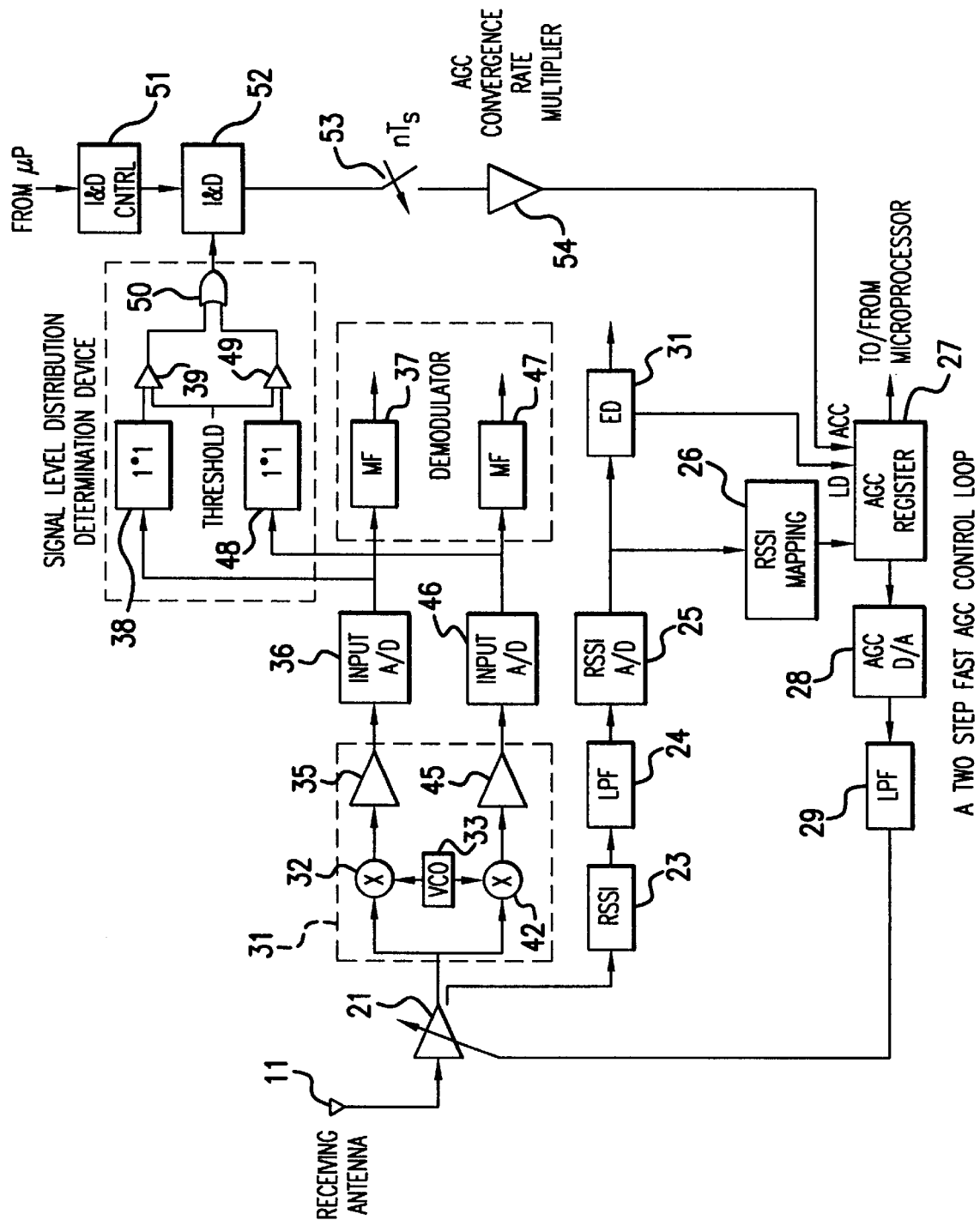
FIG. 1 is a block diagram of a two-step fast AGC control loop.

Reference now is made in detail to the present preferred embodiments of the invention, examples of which are illustrated in the accompanying drawings.

The present invention provides a new and novel automatic-gain-control (AGC) method by which a system can adjust a received signal level very fast, while maintaining a low steady state error. The method utilizes a two-step approach by which two different types of gain control adjustments are made. The two types of gain control are the coarse AGC control and the fine AGC control.

In a preferred embodiment, the present invention is used as part of a spread-spectrum, packet-switched system, using a packet-spread-spectrum signal. The packet-switched spread-spectrum system might be used as part of a radio-based Ethernet system. The packet-switched system includes a base station communicating with a plurality of users. The packet-switched system alternatively could be used to communicate between two users, i.e., a peer-to-peer system, or several base stations could be accessed when needed. The base station and each user has a transmitter and a receiver.

In a preferred embodiment, the packet-spread-spectrum signal includes a header, followed in time by at least one channel of a spread-spectrum signal. The header is concatenated with the channel of the spread-spectrum signal. The header is generated from spread-spectrum processing, by using techniques well known in the art, a header-symbol-sequence signal with a chip-sequence signal. The header-symbol-sequence signal is a predefined sequence of symbols. The header-symbol-sequence signal may be a constant value, i.e., just a series of 1-bits or symbols, or a series of 0-bits or symbols, or alternating 1-bits and 0-bits or alternating symbols, a pseudo-random symbol sequence, or other predefined sequence as desired. The chip-sequence signal is user-defined and, in a usual practice, is used with a header-symbol-sequence signal. The header, in a preferred embodiment, is a chip-sequence signal used for the purpose of synchronization.

Each spread-spectrum channel part of the packet-spread-spectrum signal is generated similarly, from techniques well known in the art as used for the header, by spread-spectrum processing a data-sequence signal with a respective chip-sequence signal. The data-sequence signal may be derived from data, or an analog signal converted to data, signaling information, or other source of data symbols or bits. The chip-sequence signal can be user-defined, and preferably is orthogonal to other chip-sequence signals used for generating the plurality of spread-spectrum channels.

Coarse AGC Control

The present invention provides a two-step fast automatic-gain-control (AGC) loop, for use with a receiver. The AGC loop comprises elements for coarse AGC control and elements for fine AGC control. Some of the elements used for coarse AGC control are common with the elements used for fine AGC control. The AGC loop, for coarse control, comprises an AGC amplifier, received-signal-strength-indicator (RSSI) means, RSSI-mapping means, and AGC-storing means.

The RSSI means is coupled to the AGC amplifier. From an output signal from the AGC amplifier, the RSSI means generates an RSSI signal proportional to a received-signal-power level of the received signal. The RSSI-mapping means is coupled to the RSSI means. The RSSI-mapping means has an RSSI mapping table. In response to the RSSI signal, the RSSI-mapping means outputs, using the RSSI mapping table, an AGC signal. The AGC-storing means is coupled to the RSSI-mapping means. The AGC-storing means stores the AGC signal. In response to the stored-AGC signal, the AGC amplifier adjusts the AGC gain.

The term "AGC signal" broadly means the signal which adjusts the AGC amplifier. The AGC signal may be embodied as an analog signal or digital signal, and the AGC signal may be converted to analog or digital form, in accordance with design requirement. The term "analog-AGC signal" specifies the AGC signal as an analog signal. The term "digital-AGC signal" specifies the AGC signal as a digital signal.

In the exemplary arrangement depicted in FIG. 1, the RSSI means is embodied as an RSSI circuit 23. The RSSI-mapping means is embodied as an RSSI analog-to-digital converter 25 and an RSSI-mapping circuit 26. The AGC-storing means is embodied as an AGC register 27 and an AGC digital-to-analog converter 28.

In an alternative embodiment using analog signals, the AGC-storing means may be embodied as a capacitor or a network of resistor, capacitor or inductor, for storing an analog-AGC signal. The preferred embodiment, however, uses digital signals, as is disclosed in FIG. 1.

The RSSI circuit 23 is coupled to the AGC amplifier 21. In response to an output signal from the AGC amplifier, the RSSI circuit 23 generates an RSSI signal proportional to a received-signal-power level of the received signal at a radio frequency (RF) stage of the receiver. The RSSI signal may be a waveform or signal level which varies proportionally to the received-signal-power level.

The RSSI analog-to-digital converter 25 is coupled to the RSSI circuit 23. The RSSI analog-to-digital converter 25 converts the RSSI signal to a digital-RSSI signal. The RSSI-mapping circuit 26 is coupled to the RSSI-analog-to-digital converter 25. The RSSI-mapping circuit 26 includes an RSSI-mapping table. From the digital-RSSI signal, the RSSI-mapping circuit 26 outputs, using the RSSI mapping table, a digital-AGC signal.

The AGC register 27 is coupled to the RSSI-mapping circuit 26. The AGC register 27 stores the digital-AGC signal. The AGC digital-to-analog converter 28 also is coupled to the AGC register 27 and through low pass filter 29 to the AGC amplifier 21. The AGC digital-to-analog converter 28 converts the digital-AGC signal to an analog-AGC signal, which passes through low pass filter 29 to AGC amplifier 21. The AGC amplifier 21, in response to the analog-AGC signal, adjusts the AGC gain.

Coarse AGC control preferably is a one-shot coarse setting of the AGC circuit, in response to a received signal strength indicator measurement being mapped through a locally kept mapping table. The RSSI signal is proportional, or has a value which is proportional, to the received signal power at the RF stage of the receiving system.

The invention does not consider or depend on a particular generation of an RSSI signal. The RSSI-mapping table produces a value which is particular to the RSSI signal generation of the RF stage. That is, the RSSI-mapping table accounts for the nonlinear mapping of the received signal power to the RSSI signal. It is desirable, but not necessary, for the locally kept RSSI mapping table to be set during system assembly and kept fixed for all subsequent system operations. Under the current invention, the system may update the RSSI-mapping table at regular intervals or during power up. This could account for changes in the RSSI measurements due to component aging.

The present invention also includes a two-step fast automatic-gain-control (AGC) method, for use with a receiver. The AGC amplifier 21 has an AGC gain. The method, for coarse control, comprises the steps of amplifying, with the AGC amplifier, a received signal, and generating an RSSI signal proportional to a received-signal-power level of the received signal. The steps include mapping, using a RSSI mapping table, an AGC signal, storing the AGC signal, and adjusting, in response to the stored-AGC signal, the AGC gain of the AGC amplifier.

The received signal at the RF stage is first filtered, amplified and then input to the AGC amplifier 21 whose gain is controlled by a filtered analog-AGC signal output from the AGC digital-to-analog converter 28. The amplified signal level power is measured to produce the RSSI signal. The RSSI signal is filtered by RSSI low pass filter 24 and then digitized via a RSSI analog-to-digital converter 25. The digital RSSI signal normally is processed by an energy detector whose output signals the reception of a signal whose energy is above a predetermined level. Having determined that a signal of interest has been received, i.e., the output of the energy detector has exceeded some threshold, the output of the energy detector amplitude needs to be adjusted so that the receiver can process it further. For that, the digitized RSSI signal is mapped through the RSSI-mapping table and loaded to the AGC register 27. The AGC register 27 is a register whose value can be read, loaded externally, or changed according to a number at its input. The output of the AGC register 27 is input to the AGC digital-to-analog converter 28 whose output in turn controls the gain of the AGC amplifier 21. This constitutes the coarse AGC control of the AGC system. The total delay of this action mainly depends on the amount of filtering on the RSSI measurement, the delay through the mapping table, and the RSSI analog-to-digital converter 25 and AGC digital-to-analog converter 28. The total delay can be adjusted according to the application.

Fine AGC Control

In general, the coarse AGC type of adjustment is too coarse for most systems and is reserved for system initialization. A finer adjustment is then necessary. This finer adjustment is covered by the fine AGC control.

The fine AGC control of the two-step fast AGC loop includes converter means, error means, integrate-and-dump means, and normalizing means.

The converter means is coupled to the AGC amplifier. The error means is coupled to the converter means. The integrate-and-dump means is coupled to the error means. The normalizing means is coupled to the integrate-and-dump means and to the storing means.

The converter means converts the output signal from the AGC amplifier to an in-phase component and a quadrature-phase component at a processing frequency.

The error means determines an error signal from the in-phase component and the quadrature-phase component. When the error signal indicates that both the in-phase component and the quadrature-phase component are high, the integrate-and-dump means increments a counter of the integrate-and-dump means. When the error signal indicates that both the in-phase component and the quadrature-phase component are low, the integrate-and-dump means decrements the counter of the integrate-and-dump means. When the error signal indicates that the in-phase component and the quadrature-phase component are different, the integrate-and-dump means does not change the counter of the integrate-and-dump means. The output of the integrate-and-dump means is denoted an I&D signal.

In an alternative embodiment, the AGC amplifier, the converter means and the error means may use an in-phase component, without the quadrature-phase component. In such an embodiment, only the real component of the signal is utilized.

The normalizing means normalizes the I&D signal, thereby generating a normalized signal. The AGC-storing means, using the normalized signal, updates the AGC signal. The AGC amplifier, in response to the updated AGC signal, adjusts the AGC gain.

As shown in FIG. 1, the two-step fast AGC loop, for fine control, embodies the converter means as an in-phase product device 32 and a quadrature-phase product device 42 coupled to a signal source 33 such as a voltage-controlled oscillator (VCO) or crystal oscillator. The converter means also may include an in-phase analog-to-digital converter 36 and a quadrature-phase analog-to-digital converter 46 coupled to the in-phase product device 32 and the quadrature-phase product device 42, respectively, through the amplifiers 35, 45. The in-phase product device 32 is coupled through an in-phase amplifier 35 to the in-phase analog-to-digital converter 36, and the quadrature-phase product device 42 is coupled through the quadrature-phase amplifier 45 to the quadrature-phase analog-to-digital converter 46.

The error means may be embodied as an in-phase magnitude device 38, an in-phase comparator 39, a quadrature-phase magnitude device 48, a quadrature-phase comparator 49, and a logic gate 50. The in-phase magnitude device 38 is coupled through the in-phase analog-to-digital converter 36 to the in-phase product device 32, and to the in-phase comparator 39. The quadrature-phase magnitude device 48 is coupled through the quadrature-phase analog-to-digital converter 46 to the quadrature-phase product device 42, and to the quadrature-phase comparator 49. The logic gate 50 is coupled to the in-phase comparator 39 and to the quadrature-phase comparator 49.

A data demodulator can include an in-phase matched filter 37 and a quadrature-phase matched filter 47. The in-phase matched filter 37 is coupled to the in-phase amplifier 35, and the quadrature-phase matched filter 47 is coupled to the quadrature-phase amplifier 45.

The integrate-and-dump means is embodied as an integrate-and-dump circuit 52, an integrate-and-dump control circuit 51, and a sample and hold device 53. The normalizing means is embodied as an AGC-convergence-rate multiplier 54. In its simplest form, the normalizing means may be embodied as an amplifier or other gain or attenuation circuit, as is well known in the art, for normalizing a signal.

In an analog embodiment the integrate-and-dump means might be embodied as a capacitor or as a resistor and capacitor network. For the analog embodiment, the error signal would increase or decrease charge on the capacitor, with such increasing/decreasing being analogous to incrementing/decrementing a counter, respectively.

The in-phase product device 32 and the quadrature-phase product device 42 are coupled to the AGC amplifier 21. The in-phase product device 32 and the quadrature-phase product device 42 convert the output signal from the AGC amplifier 21 to an in-phase component and a quadrature-phase component at a processing frequency.

The in-phase analog-to-digital converter 36 converts the in-phase component to a digital in-phase signal. The quadrature-phase analog-to-digital converter 46 converts the quadrature-phase component to a digital quadrature-phase signal.

The in-phase magnitude device 38 determines an in-phase magnitude of the digital in-phase signal. The quadrature-phase magnitude device 48 determines a quadrature-phase magnitude of the digital quadrature-phase signal.

The in-phase comparator 39 compares the in-phase magnitude to a preset threshold, thereby generating an in-phase binary signal. The quadrature-phase comparator 49 compares the quadrature-phase magnitude to the preset threshold, thereby generating a quadrature-phase binary signal.

The logic gate 50 combines or compares the in-phase binary signal and the quadrature-phase binary signal, to generate an error signal. When the error signal indicates that both the in-phase magnitude and the quadrature-phase magnitude are high, the integrate-and-dump circuit 52 increments a counter of the integrate-and-dump circuit 52. When the error signal indicates the in-phase magnitude and the quadrature-phase magnitude are low, the integrate-and dump circuit 52 decrements the counter of the integrate-and-dump circuit 52. When the error signal indicates the in-phase magnitude and the quadrature-phase magnitude are different, the integrate-and-dump circuit 52 does not change the counter in the integrate-and-dump circuit 52. The output of the integrate-and-dump circuit 52 is denoted an I&D signal.

The AGC-convergence-rate multiplier 54 normalizes the I&D signal, thereby generating a normalized signal. Using the normalized signal, the AGC register 27 updates the digital AGC signal. The AGC digital-to-analog converter 28 converts the updated digital-AGC signal to an updated analog-AGC signal. The AGC amplifier 21, in response to the updated analog AGC signal, adjusts the AGC gain.

In use of digital communication systems, a received signal, after being filtered and amplified is normally down-converted and digitized. The digital information is then processed to recover the transmitted data. However, the down-converted analog signal must be digitized properly so that no significant degradation in system performance occurs. That is, given that the input analog-to-digital converters have a certain finite accuracy, a low level digitized signal may not be represented with sufficient accuracy. The same principle holds for an input signal whose level exceeds the AGC operating range.

In the present invention, the output of the input analog-to-digital converters is processed to obtain information for fine adjustment of the AGC amplifier. The output of the input analog-to-digital converters is input into a signal level measuring device which consequently produces an error signal for fine adjustment of the AGC level. The error signal is added to the AGC register, whose contents are then used to drive the AGC digital-to-analog converter.

The signal level measuring device determines the signal level distribution at its input. Different signals require different approaches to their level distribution determination. For example, for a Gaussian noise-like signal with a zero mean, the signal variance completely describes the signal level distribution. In some applications, it is of interest to keep the maximum input signal level within the operational range of the input analog-to-digital converters. A device determining for the maximum input is then required. In the case where the signal is not stationary, i.e., where the statistics of the input signal level can change in time, a more sophisticated signal level distribution device is required. There are a great number of ways, in the existing literature, for determining the amplitude distribution of a signal.

In the present invention, the in-phase signal and quadrature-phase signal from the output of the down-converter are each input into an absolute value, or magnitude, device. The magnitude device outputs its input, if the input is positive, or the negative of its input, if the input is negative. The outputs of the absolute value devices are then each compared to a preset threshold producing a pair of binary valued outputs signifying whether each of the absolute value device outputs has crossed the preset threshold or not. The above comparison may be implemented using a pair of comparators, with each set to the preset threshold. The two binary comparator outputs are combined to form an error signal which, after being processed, can be used to fine adjust the AGC amplifier. The error signal is used to drive an integrate and dump (I&D) circuit. The integrate-and-dump circuit accumulates the signal at its input for a predetermined time interval and then dumps, or reinitializes, its contents to zero. If the outputs of both comparators are high, then the integrate-and-dump counter is incremented. If both comparator outputs are low the integrate-and-dump counter is decremented. When the comparator outputs are different there is no change in the integrate-and-dump counter. The integration interval for the integrate-and-dump circuit can be programmed to satisfy specific system requirements. At the end of each integration interval the output of the integrate-and-dump is normalized by a AGC-convergence-rate, whose value is predetermined, and used to update the AGC register. The normalization factor depends on the designers convergence requirements and AGC control stability.

The fine adjustment of the two-step fast AGC method comprises the steps of converting an output signal from the AGC amplifier to an in-phase component and a quadrature-phase component at a processing frequency, and determining an error signal from the in-phase component and the quadrature-phase component. When the error signal indicates that both the in-phase component and the quadrature-phase component are high, the method increments a counter of the integrate-and-dump circuit. When the error signal indicates that both the in-phase component and the quadrature-phase component are low, the method decrements the counter of the integrate-and-dump circuit. When the error signal indicates the in-phase component and the quadrature-phase component are different, the method does not change the counter of the integrate-and-dump circuit.

The method then includes the steps of normalizing the I&D signal, thereby generating a normalized signal, and updating, in response to the normalized signal, the AGC signal. Using the updated AGC signal, the method adjusts the AGC gain of the AGC amplifier.

Figure 2:
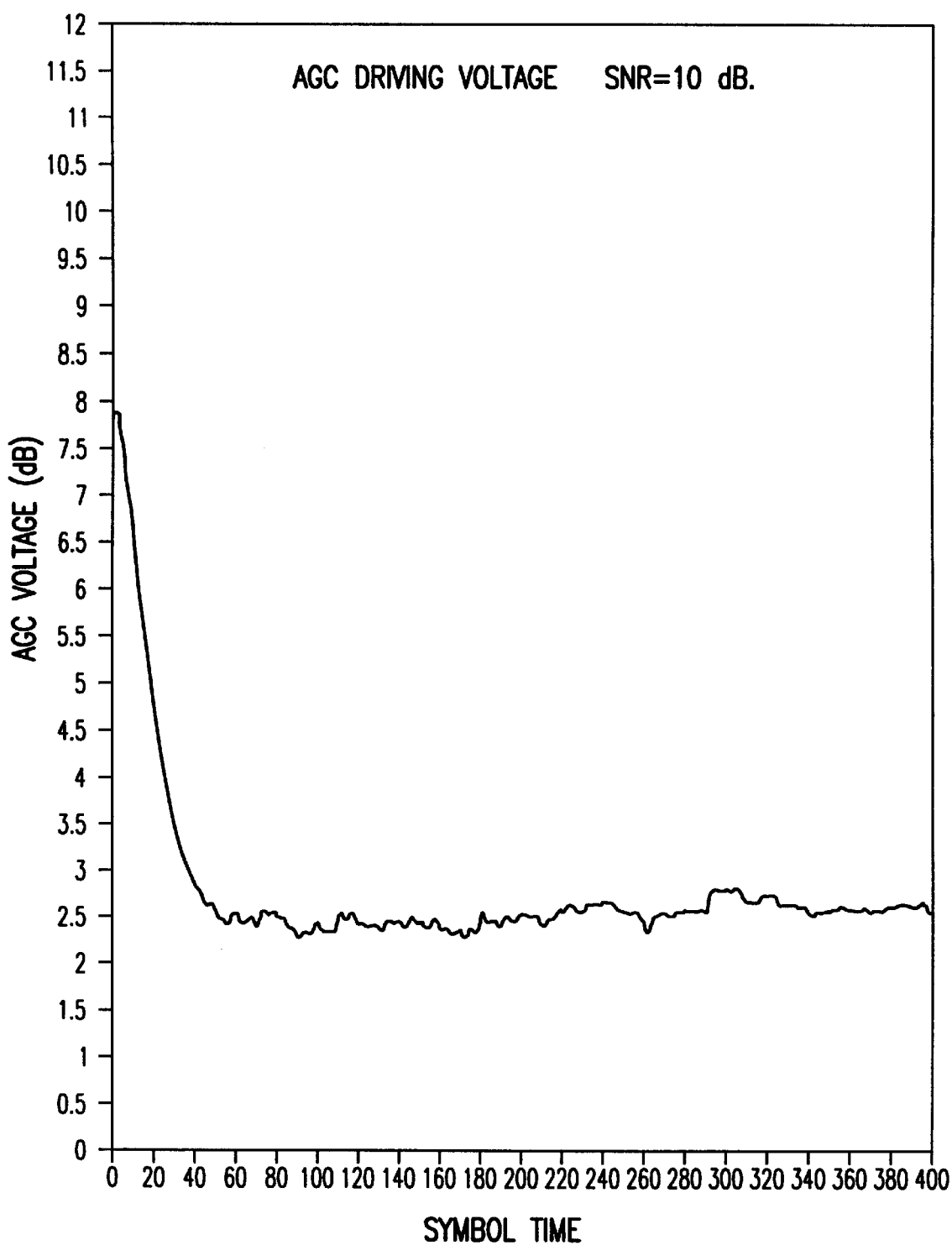
FIG. 2 illustrates convergence of the AGC loop.
Figure 3:
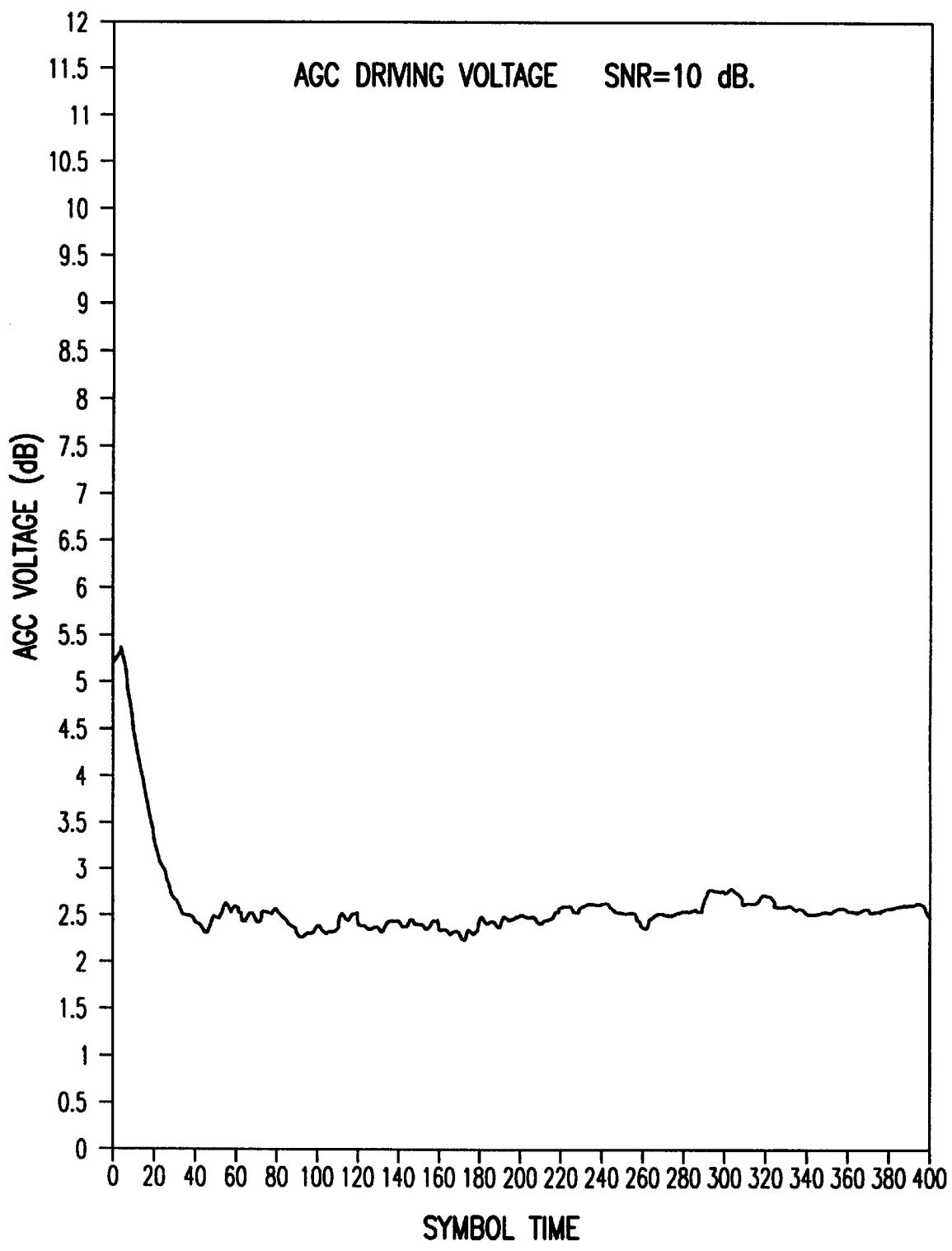
FIGS. 3 and 4 illustrate convergence of the AGC loop for different initial coarse settings.
Figure 4:
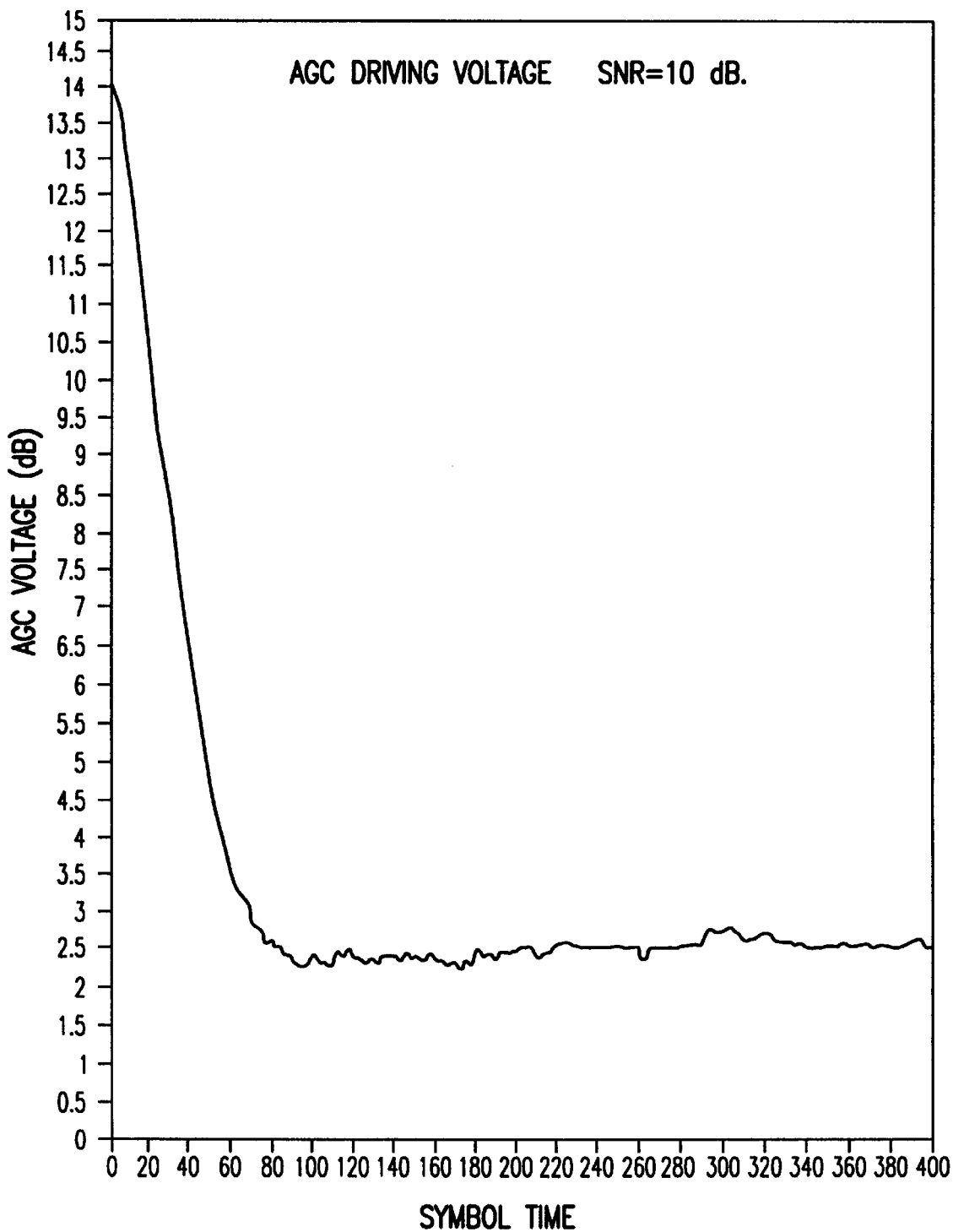

The graph in FIG. 2 shows the convergence of the AGC loop where the vertical axis represents the received signal power after AGC and the horizontal axis represents time in received symbol periods. In this setup, only the fine adjustment of the AGC is shown, whereas at time zero, the initialization of the AGC using the coarse adjust is assumed to have corrected the received level to about 10 dB. FIGS. 3 and 4 show the AGC system performance for different initial coarse settings by the coarse AGC control.

It will be apparent to those skilled in the art that various modifications can be made to the two-step automatic-gain-control loop of the instant invention without departing from the scope or spirit of the invention, and it is intended that the present invention cover modifications and variations of the two-step automatic-gain-control loop, provided they come within the scope of the appended claims and their equivalents.

We claim:

1. A two-step automatic-gain-control (AGC) loop, for use with a receiver, comprising:
    an AGC amplifier, coupled to a receiving antenna, having an AGC gain, for amplifying a received signal;
    a received-signal-strength-indicator (RSSI) circuit, coupled to said AGC amplifier and responsive to an output signal from said AGC amplifier, for generating an RSSI signal proportional to a received-signal-power level of the received signal at a radio frequency (RF) stage of said receiver;
    an analog-to-digital converter, coupled to said RSSI circuit, for converting the RSSI signal to a digital RSSI signal;
    an RSSI-mapping circuit, coupled to said analog-to-digital converter and having an RSSI mapping table, responsive to the digital RSSI signal, for outputting, using the RSSI mapping table, a digital-AGC signal;
    an AGC register, coupled to said RSSI-mapping circuit, for storing the digital-AGC signal;
    a digital-to-analog converter, coupled to said AGC register and to said AGC amplifier, for converting the digital-AGC signal to an analog-AGC signal;
    said AGC amplifier, responsive to the analog-AGC signal, for adjusting the AGC gain;
    converter means, coupled to said AGC amplifier, for converting the output signal from said AGC amplifier to an in-phase component and a quadrature-phase component at a processing frequency;
    an in-phase analog-to-digital converter, coupled to said converter means, for converting the in-phase component to a digital in-phase signal;
    a quadrature-phase analog-to-digital converter, coupled to said converter means, for converting the quadrature-phase component to a digital quadrature-phase signal;
    an in-phase magnitude device, coupled to said in-phase analog-to-digital converter, for determining an in-phase magnitude of the digital in-phase signal;
    a quadrature-phase magnitude device, coupled to said quadrature-phase analog-to-digital converter, for determining a quadrature-phase magnitude of the digital quadrature-phase signal;
    an in-phase comparator, coupled to said in-phase magnitude device, for comparing the in-phase magnitude to a preset threshold, thereby generating an in-phase binary signal;
    a quadrature-phase comparator, coupled to said quadrature-phase magnitude device, for comparing the quadrature-phase magnitude to the preset threshold, thereby generating a quadrature-phase binary signal;
    a logic gate, coupled to said in-phase comparator and to said quadrature-phase comparator, for combining the in-phase binary signal and the quadrature-phase binary signal, to generate an error signal;
    an integrate-and-dump circuit, coupled to said logic gate and, responsive to the error signal indicating the in-phase magnitude and the quadrature-phase magnitude are high, for incrementing a counter of said integrate-and-dump circuit and, responsive to the error signal indicating the in-phase magnitude and the quadrature-phase magnitude are low, for decrementing the counter of the integrate-and-dump circuit and, responsive to the error signal indicating the in-phase magnitude and the quadrature-phase magnitude are different, for not changing the counter of said integrate-and-dump circuit, with an output of said integrate-and-dump circuit denoted an I&D signal;
    an AGC-convergence-rate multiplier, coupled to said integrate-and-dump circuit, for normalizing the I&D signal, thereby generating a normalized signal;
    said AGC register, responsive to the normalized signal, for updating the digital-AGC signal;
    said digital-to-analog converter for converting the updated digital-AGC signal, to an updated analog-AGC signal; and
    said AGC amplifier, responsive to the updated analog-AGC signal, for adjusting the AGC gain.

2. A two-step automatic-gain-control (AGC) loop, for use with a receiver, comprising:
    an AGC amplifier, having an AGC gain, for amplifying a received signal;
    received-signal-strength-indicator (RSSI) means, coupled to said AGC amplifier and responsive to an output signal from said AGC amplifier, for generating an RSSI signal proportional to a received-signal-power level of the received signal;

RSSI-mapping means, coupled to said RSSI means and having an RSSI mapping table, responsive to the RSSI signal, for outputting, using the RSSI mapping table, an AGC signal;

AGC-storing means, coupled to said RSSI-mapping means, for storing the AGC signal;

said AGC amplifier, responsive to the stored-AGC signal, for adjusting the AGC gain;

converter means, coupled to said AGC amplifier, for converting the output signal from said AGC amplifier to an in-phase component and a quadrature-phase component at a processing frequency;

error means, coupled to said converter means, for determining an error signal from the in-phase component and the quadrature-phase component;

integrate-and-dump means, coupled to said error means and, responsive to the error signal indicating the in-phase component and the quadrature-phase component are high, for incrementing a counter of said integrate-and-dump means and, responsive to the error signal indicating the in-phase component and the quadrature-phase component are low, for decrementing the counter of the integrate-and-dump means, with an output of said integrate-and-dump means denoted an I&D signal;

normalizing means, coupled to said integrate-and-dump means, for normalizing the I&D signal, thereby generating a normalized signal;

said AGC-storing means, responsive to the normalized signal, for updating the AGC signal; and said AGC amplifier, responsive to the updated AGC signal, for adjusting the AGC gain.

3. The two-step AGC loop as set forth in claim 2, with said RSSI means comprising:

a received-signal-strength-indicator (RSSI) circuit, coupled to said AGC amplifier and responsive to the output signal from said AGC amplifier, for generating the RSSI signal proportional to the received-signal-power level of the received signal; and an analog-to-digital converter, coupled to said RSSI circuit, for converting the RSSI signal to a digital RSSI signal.

4. The two-step AGC loop as set forth in claim 3, with said RSSI-mapping means comprising an RSSI-mapping circuit, coupled to said analog-to-digital converter and having the RSSI mapping table, responsive to the digital RSSI signal, for outputting, using the RSSI mapping table, a digital-AGC signal.

5. The two-step AGC loop as set forth in claim 4, with said AGC-storing means including:

an AGC register, coupled to said RSSI-mapping circuit, for storing the digital-AGC signal; and a digital-to-analog converter, coupled to said AGC-storing means and to said AGC amplifier, for converting the digital-AGC signal, to the AGC signal.

6. The two-step AGC loop as set forth in claim 2, with said error means comprising:

an in-phase analog-to-digital converter, coupled to said converter means, for converting the in-phase component to a digital in-phase signal;

a quadrature-phase analog-to-digital converter, coupled to said converter means, for converting the quadrature-phase component to a digital quadrature-phase signal;

an in-phase magnitude device, coupled to said in-phase analog-to-digital converter, for determining an in-phase magnitude of the digital in-phase signal;

a quadrature-phase magnitude device, coupled to said quadrature-phase analog-to-digital converter, for determining a quadrature-phase magnitude of the digital quadrature-phase signal;

an in-phase comparator, coupled to said in-phase magnitude device, for comparing the in-phase magnitude to a preset threshold, thereby generating an in-phase binary signal;

a quadrature-phase comparator, coupled to said quadrature-phase magnitude device, for comparing the quadrature-phase magnitude to the preset threshold, thereby generating a quadrature-phase binary signal;

a logic gate, coupled to said in-phase comparator and to said quadrature-phase comparator, for combining the in-phase binary signal and the quadrature-phase binary signal, to generate the error signal.

7. The two-step AGC loop as set forth in claim 6, with said integrate-and-dump means comprising an integrate-and-dump circuit, coupled to said logic gate and responsive to the error signal indicating the in-phase magnitude and the quadrature-phase magnitude are high, for incrementing a counter of said integrate-and-dump means and, responsive to the error signal indicating the in-phase magnitude and the quadrature-phase magnitude are low, for decrementing the counter of the integrate-and-dump means, with an output of said integrate-and-dump circuit denoted an I&D signal.

8. The two-step AGC loop as set forth in claim 2, with said normalizing means comprising an AGC-convergence-rate multiplier, coupled to said integrate-and-dump means, for normalizing the I&D signal, thereby generating a normalized signal.

9. The two-step AGC loop as set forth in claim 3, with said normalizing means comprising an AGC-convergence-rate multiplier, coupled to said integrate-and-dump means, for normalizing the I&D signal, thereby generating a normalized signal.

10. The two-step AGC loop as set forth in claim 4, with said normalizing means comprising an AGC-convergence-rate multiplier, coupled to said integrate-and-dump means, for normalizing the I&D signal, thereby generating a normalized signal.

11. The two-step AGC loop as set forth in claim 5, with said normalizing means comprising an AGC-convergence-rate multiplier, coupled to said integrate-and-dump means, for normalizing the I&D signal, thereby generating a normalized signal.

12. The two-step AGC loop as set forth in claim 6, with said normalizing means comprising an AGC-convergence-rate multiplier, coupled to said integrate-and-dump means, for normalizing the I&D signal, thereby generating a normalized signal.

13. A two-step automatic-gain-control (AGC) method, for use with a receiver having an AGC amplifier with an AGC gain, comprising the steps of:

amplifying, with said AGC amplifier, a received signal;

generating a received-signal-strength-indicator (RSSI) signal proportional to a received-signal-power level of the received signal;

mapping, using a RSSI mapping table, an AGC signal;

storing the AGC signal;

adjusting, in response to the stored-AGC signal, the AGC gain of said AGC amplifier;

converting an output signal from said AGC amplifier to an in-phase component and a quadrature-phase component at a processing frequency;

determining an error signal from the in-phase component and the quadrature-phase component;

incrementing, in response to the error signal indicating the in-phase component and the quadrature-phase component are high, a counter of an integrate-and-dump circuit;

decrementing, in response to the error signal indicating the in-phase component and the quadrature-phase component are low, the counter of the integrate-and-dump circuit;

normalizing an output of the integrate-and-dump circuit, thereby generating a normalized signal;

updating, in response to the normalized signal, the AGC signal; and adjusting, in response to the updated AGC signal, the AGC gain of said AGC amplifier.

* * * * *